United States Patent [19]

Coiner et al.

[11] Patent Number: 4,667,155
[45] Date of Patent: May 19, 1987

[54] MODULAR MOLDED VACUUM TEST FIXTURE

[75] Inventors: Russell E. Coiner, Staunton; Henri T. Burgers, Grottoes; Jeffery P. Stowers, Afton, all of Va.

[73] Assignee: Virginia Panel Corporation, Waynesboro, Va.

[21] Appl. No.: 816,896

[22] Filed: Jan. 7, 1986

[51] Int. Cl.$^4$ .................. G01R 31/28; G01R 15/12
[52] U.S. Cl. ........................ 324/158 F; 324/73 PC
[58] Field of Search ............ 324/158 F, 158 P, 72.5, 324/73 PC; 339/117 P

[56] References Cited

U.S. PATENT DOCUMENTS 4,344,033  8/1982  Stowers et al. .................. 324/158 P Primary Examiner—Ernest F. Karlsen
Assistant Examiner—Vinh P. Nguyen
Attorney, Agent, or Firm—B. P. Fishburne, Jr.

[57] ABSTRACT

A vacuum test fixture for the in-circuit and functional testing of loaded printed circuit boards is disclosed. Key components of the test fixture are made from inexpensive state-of-the-art structural plastics under new molding techniques. As a result, a much lighter, more convenient, more compact and considerably less expensive vacuum test fixture is realized without loss of dimensional precision and stability in the most vital components of the fixture. The fixture is constructed to be snapped together and retained by a unitary structurally sound molded trim frame which is lightweight and durable and can be manipulated without tools. An effective seal is established between a top plate and an insert retainer for a lower plate of the fixture by an adhesive-free from fitting neoprene gasket which embraces the margin of the top plate. To create an air seal between the PCB and vacuum test fixture, a closed cell double skin neoprene pad is adhesively attached to the top plate of the fixture. Manually operated thumb screws are used to secure the bottom plate of the fixture removably in the molded insert retainer. Precision tooling pins hold the top and bottom plates horizontally aligned so that the test probes carried by the bottom plate accurately engage the PCB electrical components and experience only linear vertical motion during the test operation.

7 Claims, 8 Drawing Figures

MODULAR MOLDED VACUUM TEST FIXTURE

BACKGROUND OF THE INVENTION

The general objective of the present invention is to improve on that class of vacuum test fixture shown in U.S. Pat. No. 4,344,033, issued Aug. 10, 1982, to Stowers et al.

More particularly, it is an object of the present invention to provide a modular vacuum fixture of greater simplicity and compactness, reduced weight and greatly increased convenience of use and versatility.

Another object of the invention is to provide a modular vacuum test fixture for loaded PCBs in which key components of the fixture are formed from state-of-the-art molded structural plastics with precision and without sacrificing strength and durability. Similarly, in accordance with the invention, the top plate and lower pin plate of the test fixture are formed from a laminated glass epoxy resin, selected because of its outstanding dielectric characteristics and machinability. In the prior art, these components were formed of a phenolic compound, or the like, and were very difficult to drill with precision, and required greater thickness in their fabrication to achieve stability and consequently were much heavier than the critical top and bottom laminated epoxy glass resin plates employed in the present invention. For example, the bottom plate in the present invention need be no thicker than ⅜th inch. Point drilling is made easier and more accurate in the thinner material. Somewhat increased material costs are partially offset by reductions in machining costs and production time. The new material for the top and bottom plates of the fixture enables a very accurate dense drilling pattern of up to 0.040 inches between centers.

Another object of the invention is to provide a more economical and more effective gasket applied removably to the margin of the top plate of the fixture without adhesive and having a yielding skirt portion capable of forming an air-tight seal with an underlying lower plate retainer or frame formed of injection molded high strength plastics material, preferably ABS "CYCOLAC".

A further important object of the invention is to provide a vacuum test fixture of the above-mentioned type which can be snapped together as an assembly and separated into its components by hand without tools. In the assembly, manual thumb screws are employed to retain the bottom plate carrying the electrical contact pins or probes removably assembled with the bottom plate retainer or frame, the entire structure being characterized by simplicity and greatly increased convenience of use.

Other features and advantages of the invention will become apparent to those skilled in the art during the course of the following detailed description.

DETAILED DESCRIPTION

Figure 1:
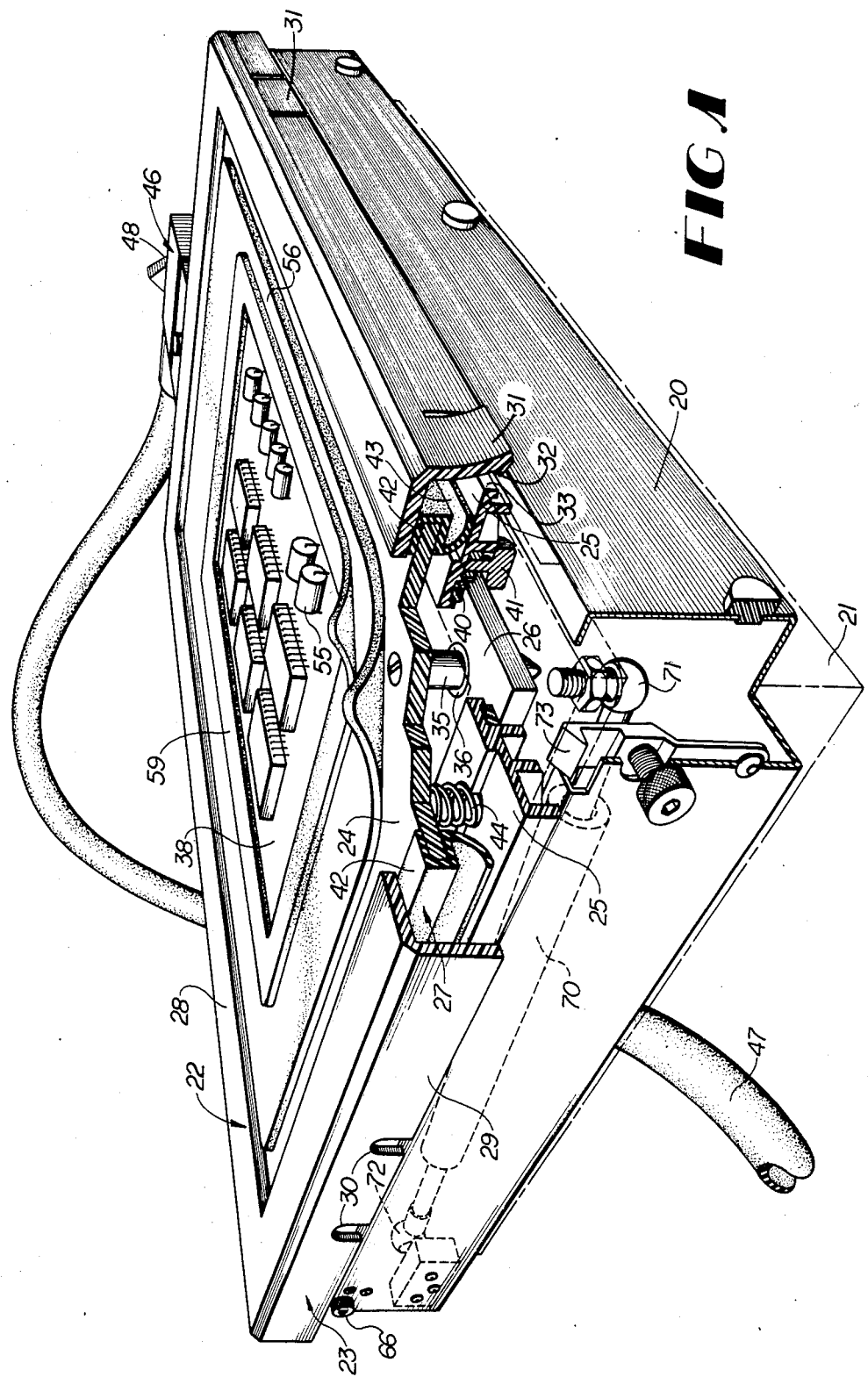
FIG. 1 is a perspective view of a modular vacuum test fixture, partly in cross section, according to the present invention.
Figure 2:
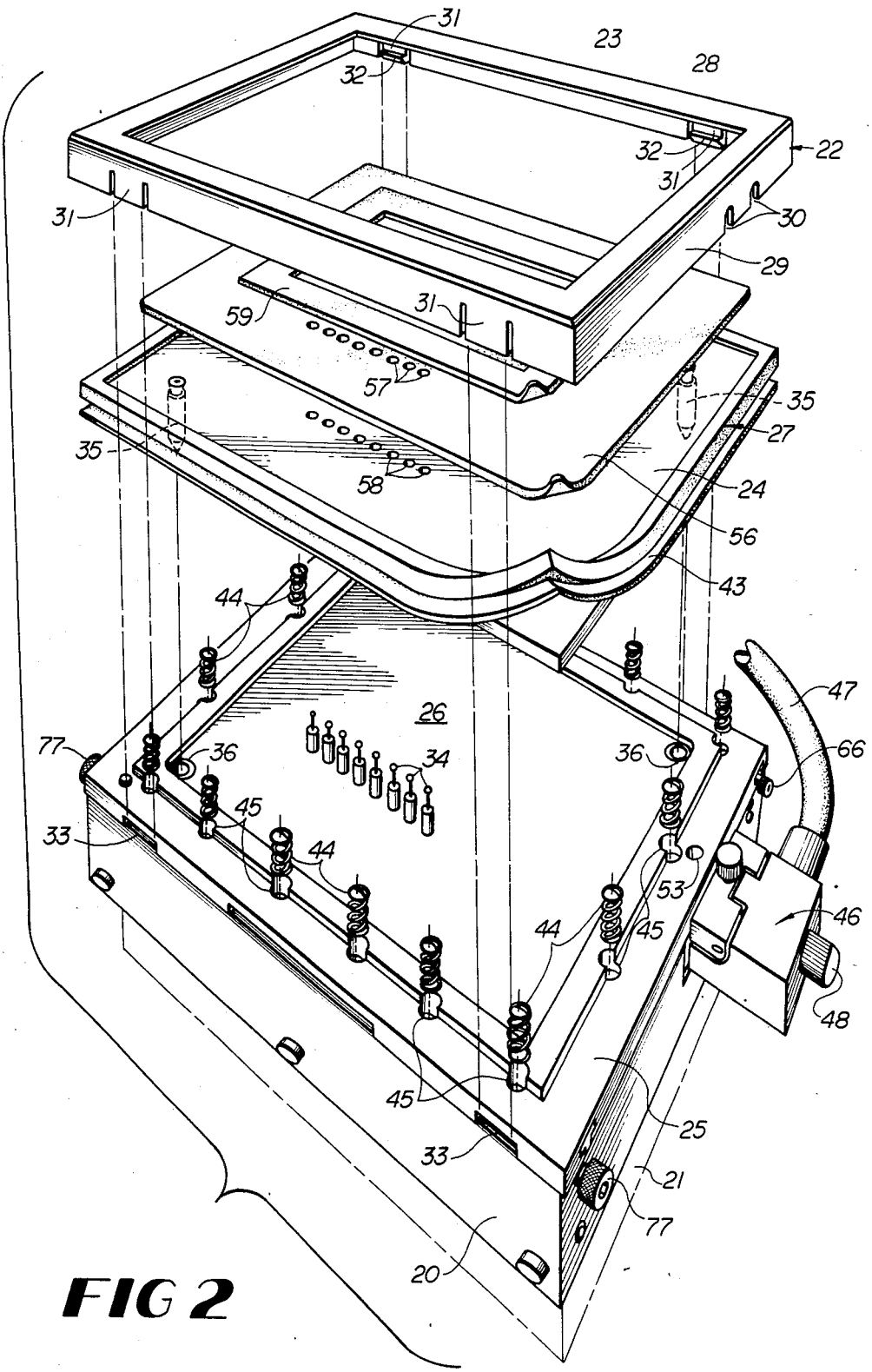
FIG. 2 is an exploded perspective view of the test fixture.

Referring to the drawings in detail, wherein like numerals designate like parts, a modular vacuum test fixture according to the present invention includes a preferably sheet metal base frame 20 adapted for connection in a conventional manner with a suitable adapter frame 21, in turn adapted for connection with a suitable receiver frame, not shown, employed to interface the vacuum test fixture with a testing apparatus, substantially as described in U.S. Pat. No. 4,344,033.

Hinged to the base frame 20 near the top thereof and along the rear longitudinal side of the base frame is a test fixture assembly 22 consisting of an exterior rectangular trim frame 23, an upper flat rectangular plate 24, an underlying bottom plate retainer or frame 25, a bottom pin plate 26, and a sealing gasket 27 on the margin of the top plate 24.

In the above assembly 22, the trim frame 23 and the bottom plate retainer 25 are injection molded as separate units from a tough, durable, chip-resistant lightweight structural plastics material, preferably ABS "Cycolac" or equivalent material. Such material is dimensionally stable and can be injection molded with precision.

The trim frame 23 is of L-cross section including a flat top wall 28 and a marginal vertical wall 29 extending continuously around its perimeter. A pair of slots 30, for a purpose to be described, is formed through the vertical wall 29 of the trim frame on one side thereof and near and forwardly of its rear longitudinal side. At its front and rear and near its corners, the vertical wall 29 of the rectangular trim frame 23 is equipped with integral somewhat resilient snap locking tabs 31 lying in the vertical plane of the wall 29 and carrying integral beveled latch heads 32 at their bottoms and on their interior sides. Coacting molded keepers 33 for the latch heads 32 are formed in the retainer or frame 25 at the outer margin thereof in alignment with the locking tabs 31 and their beveled latch heads. This simple arrangement allows the several components of the above-noted assembly 22 to be releasably locked together manually in a snap locking mode, and to be separated without the use of tools.

The top plate 24 and bottom pin plate 26 are both formed from a laminated glass epoxy resin known commercially as G-10. This particular material is dimensionally stable and easily machinable. For example, it can be drilled through in a dense drilling pattern for the reception of spring contact probes 34 on centers as closely spaced as 0.040 inches.

The top plate 24 near one pair of diagonally spaced corners carries a pair of depending vertical precision tooling pins 35 securely fixed thereto and being received guidingly through "DELRIN" bushings 36 secured within openings in the bottom plate 26. This precision alignment means assures proper horizontal alignment of PCB leads 37, FIGS. 5 and 6, with the test probes 34 set in the lower plate 26 when a particular PCB 38 is undergoing testing.

The bottom plate 26 has its marginal portion received in an inner marginal recess 39 of the retainer 25 and has its top face bearing against an air-tight sealing gasket 40 secured within a groove in the retainer 25 and extending continuously around the four sides of the rectangular frame or retainer 25.

The bottom plate 26 is secured releasably in the recess 39 of the retainer by a plurality of equidistantly spaced thumb screws 41 distributed around the perimeter of the retainer 25 and being threadably engaged with metal screw-threaded inserts of the retainer. The several thumb screws 41 exert sufficient clamping force on the bottom face of the plate 26 to engage the plate sealingly with the gasket 40.

The aforementioned gasket 27 formed of solid neoprene includes an upper channel portion 42 which snugly surrounds the margin of the top plate 24 and remains removably attached to the margin of the top plate by elastic tension and without the need for adhesive, as in the prior art. This is a great advantage and convenience feature when it is necessary to replace the sealing gasket. The sealing gasket includes an integral curved depending sealing skirt portion 43 adapted to form an air-tight seal with the flat upper face of the bottom plate frame or retainer 25.

The top plate 24 is yieldingly biased upwardly and away from the bottom plate 26 by a plurality of equidistantly spaced column springs 44 around the inner margin of the retainer 25 and held in a corresponding number of cylindrical recesses 45 molded in the retainer 25. The several springs 44 exert an evenly distributed upward force against the top plate 24 without tendency to warp the same. The space between the top and bottom plates 26 inwardly of the gasket sealing skirt 43 constitutes a vacuum chamber which, at proper times, is subjected to a partial vacuum applied thereto by a vacuum adapter 46, substantially as shown in prior U.S Pat. No. 4,344,033.

The vacuum adapter 46 has suction applied thereto from a remote source through a hose 47 and is equipped with a vacuum on-off valve 48. The vacuum adapter 46 is secured in the operative position on the assembly 22 by pins 49 which plug into openings formed in the lower plate retainer 25, the pins 49 also being received through the slots 30 of trim frame 23. The adapter 46 includes an extension 50 projecting through a clearance recess 51 in base frame 20 and having an upwardly facing vacuum port 52 in coaxial alignment with a vacuum port 53 formed through the retainer 25. A compressible ring seal or gasket 54 is disposed between the extension 50 of the vacuum adapter and the bottom face of the retainer or frame 25, as shown in FIGS. 5 and 6.

It can be seen that the vacuum chamber between the two plates 24 and 26 inwardly of the gasket sealing skirt 43 is in direct communication with the vacuum adapter 46. When a partial vacuum is established in this chamber, the top plate 24 will be drawn downwardly vertically toward the bottom plate 26, compressing the column springs 44, as shown in FIG. 6, and causing the contact probes 34 to electrically engage components 55 of the PCB 38 under test. Due to the precision guidance afforded by the tooling pins 35, the contact probes 34 are subjected to a pure linear vertical action and are never bent laterally.

Figure 5:
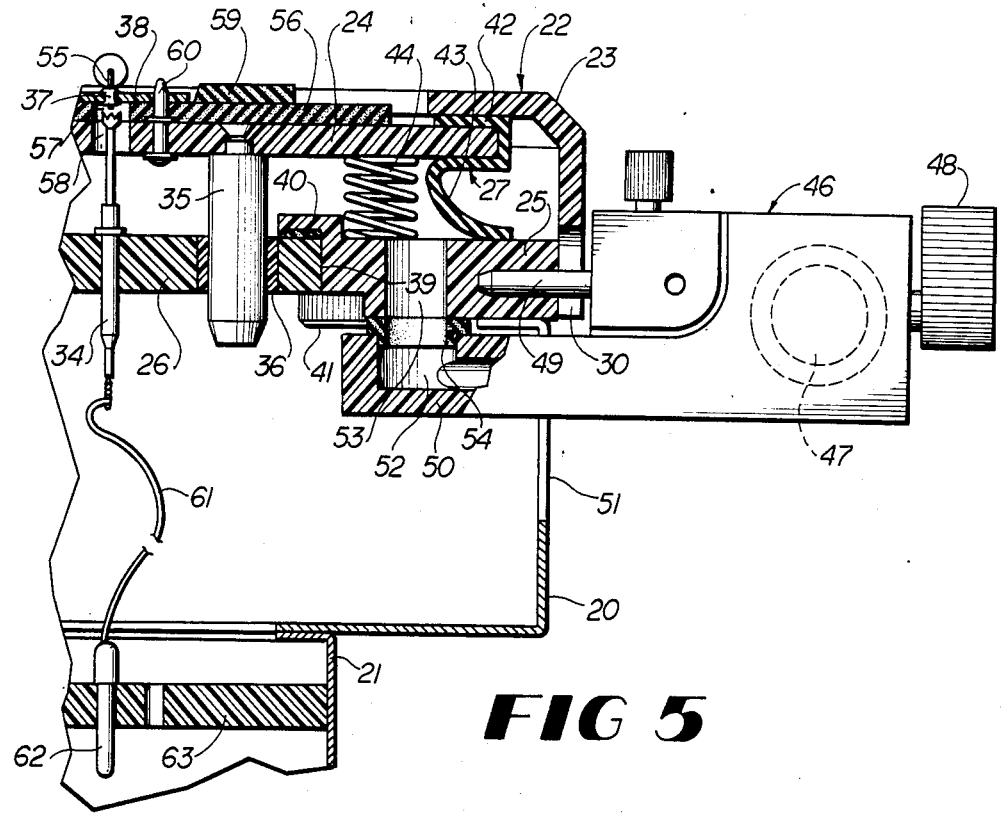
FIG. 5 is an enlarged fragmentary vertical section taken substantially on line 5—5 of FIG. 4 with no vacuum applied to the fixture.
Figure 6:
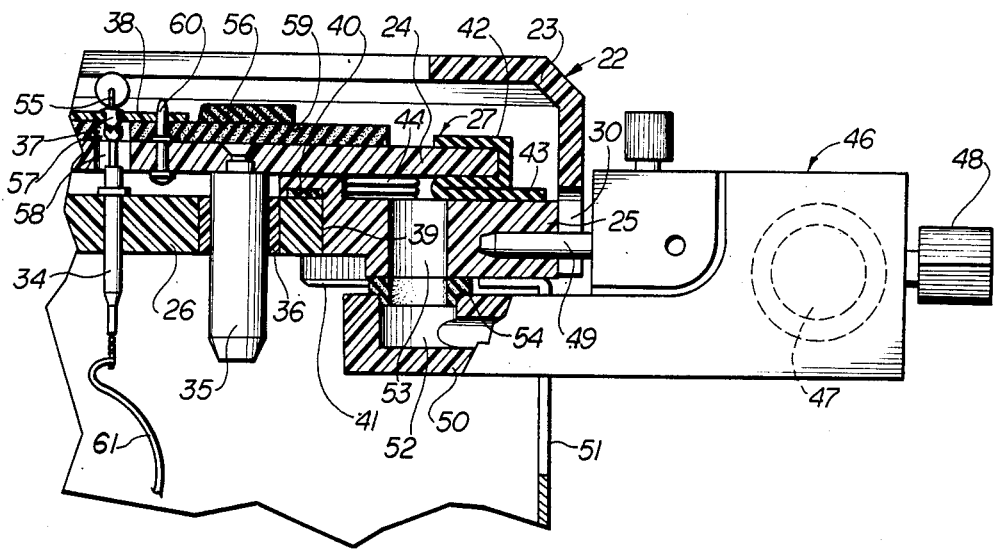
FIG. 6 is a similar view of the test fixture under vacuum.

When the vacuum is removed from the vacuum chamber, FIG. 5, the springs 44 expand and elevate the top plate sufficiently to cause disengagement of the probes 34 from the loaded PCB electrical components.

The PCB 38 under test rests on top of a closed cell double skin neoprene pad 56, adhesively secured to the rigid top plate 24. The pad 56 and top plate are provided with apertures 57 and 58 in the proper pattern to receive the tops of spring probes 34 therethrough, as shown in FIGS. 5 and 6. The pad 56 carries an overlay 59 formed of the same material as the pad and being adhesively secured to the pad. As described in U.S. Pat. No. 4,344,033, the overlay 59 is custom carved or profiled to accept a PCB of a particular configuration therein. Locator pins 60, FIGS. 5 and 6, fixed on the top plate 24, are received through locator apertures in the PCB 38 to further position the same with precision relative to the contact probes 34.

As disclosed in U.S. Pat. No. 4,344,033, lead wires 61 extending from the contact probes 34 are connected with terminals 62 of a patchboard 63 associated with the adapter frame 21 below the base frame 20.

Figure 8:
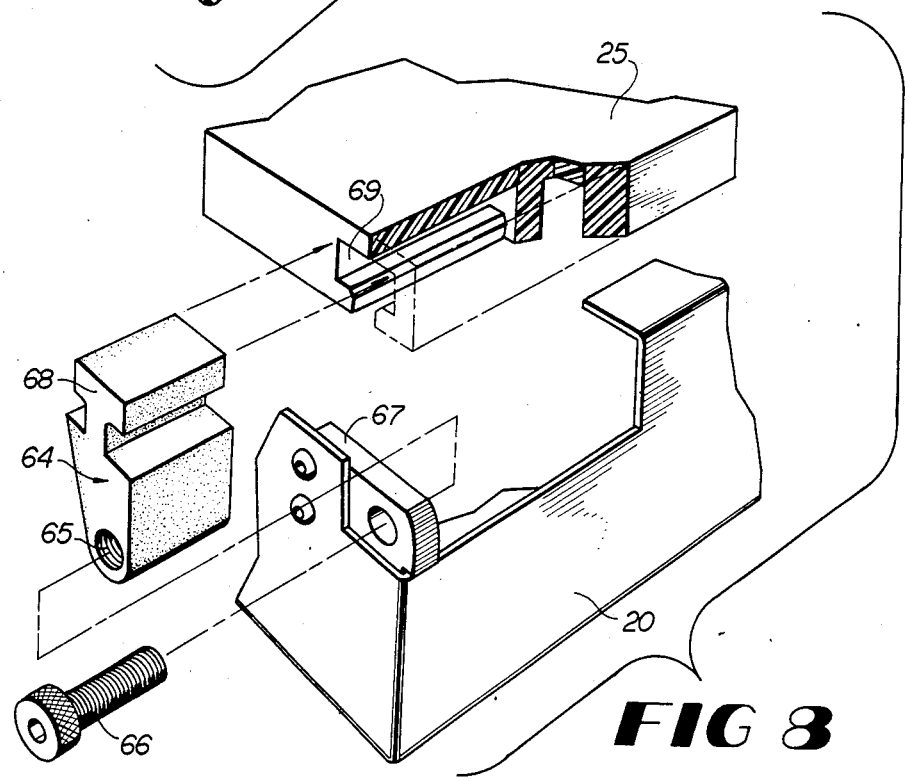
FIG. 8 is a similar exploded perspective view showing details of a hinge joint including a molded hinge block.

The test fixture assembly 22 is hingedly secured to the base frame 20 along the rear edge thereof by molded plastics hinge blocks 64, FIG. 8, having threaded apertures 65 receiving hinge screws 66 journaled in bearing plates 67 on the interior faces of the side walls of base frame 20. The molded hinge blocks 64 have integral T-heads 68, engaging in T-slots 69 molded into the lower plate retainer 25. The hinged assembly 22 is biased upwardly to the open position shown in FIG. 3 by a conventional gas-air cylinder unit 70 connected by ball joints 71 and 72 between the assembly 22 and the base frame 20. This facilitates working on the vacuum test fixture at required times.

Figure 7:
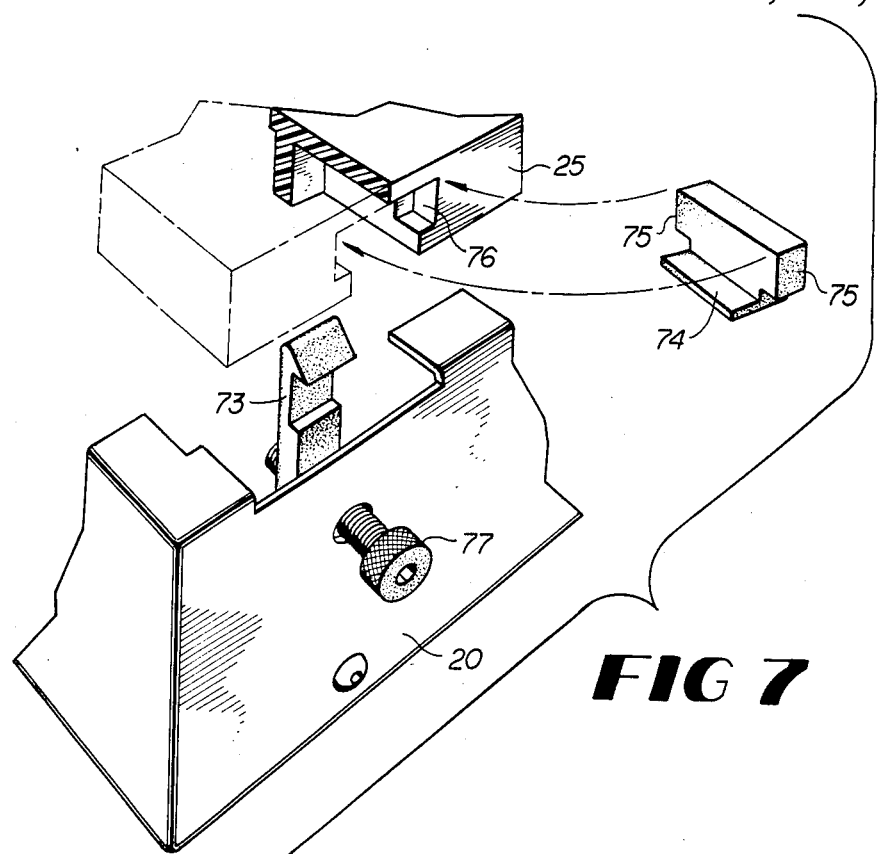
FIG. 7 is a fragmentary exploded perspective view, partly in section, of manually operated latch means on the lower base frame of the fixture which cooperate with molded keepers on the lower plate retainer.

The assembly 22 is releasably latched in a down use position by a pair of releasable spring latches near the forward corners of the base frame 20. These latches have molded plastics latch heads 73, FIG. 7, adapted to lockingly engage molded plastics keepers 74 having mounting heads 75 received in locator recesses 76 molded in the retainer 25. To enable positive locking of the assembly 22 in the closed condition for security, the spring latches are equipped with locking screws 77, as shown in the drawings.

The general usage and operation of the vacuum test fixture is well known in the prior art and therefore need not be described in detail herein. It can now be appreciated that numerous advantages of the invention set forth in the application are derived from the utilization of available moderately priced structural plastics and state-of-the-art molding techniques for making key components of the test fixture, notably its outside trim frame 23 and bottom plate retainer or frame 25. This, together with the use of laminated glass epoxy resin G-10 for the two plates 24 and 26 of the fixture, enables the creation of a much lighter, more economical and much more convenient test apparatus in the overall, as fully described above in this application. As described, one of the major benefits resulting from the employment of the improved structural plastics in fabricating the vacuum test fixture is the ability of the assembly 22 to be snapped together, and taken apart by hand, without the use of any tools. Complex and more costly cam latching devices and the like used in the prior art are entirely eliminated.

Figure 3:
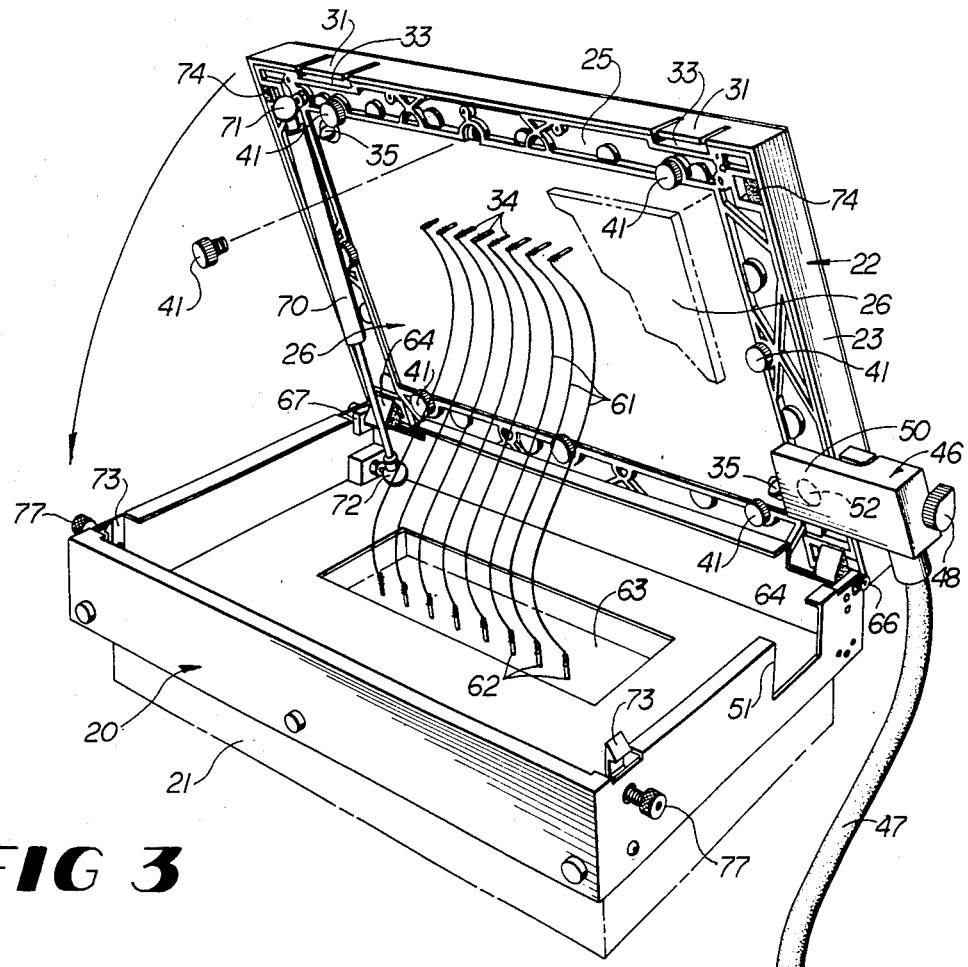
FIG. 3 is a further perspective view of the test fixture in an open position.
Figure 4:
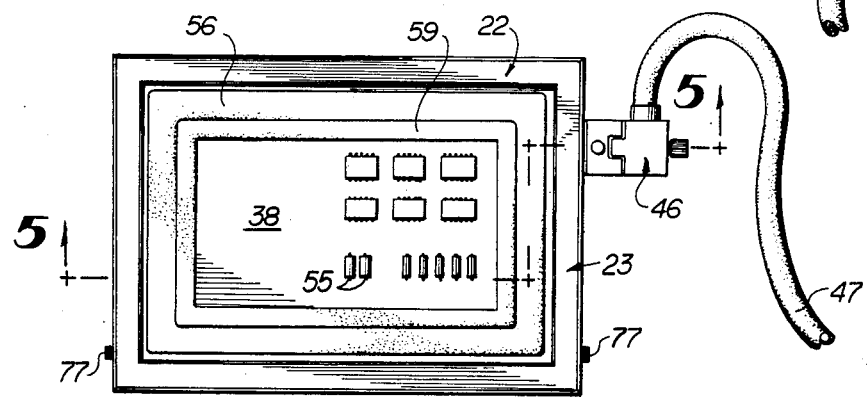
FIG. 4 is a plan view of the test fixture on a reduced scale.

It should be mentioned that the assembly 22 in the raised position, FIG. 3, can be returned easily to the down use position on the base frame 20 merely by pushing down on the assembly 22 until the latch heads 73 of the spring latches snap into engagement with the keepers 74 of the bottom plate retainer or frame 25.

It is to be understood that the form of the invention herewith shown and described is to be taken as a preferred example of the same, and that various changes in the shape, size and arrangement of parts may be resorted to, without departing from the spirit of the invention or scope of the subjoined claims.

We claim:

1. A vacuum test fixture for testing printed circuit boards comprising,
   a top plate for seating a printed circuit board under test,
   a bottom plate beneath the top plate in parallel relation thereto and carrying an array of test probes projecting above the bottom plate, the top plate having an array of apertures formed therethrough receiving the test probes,
   a bottom plate retainer frame having an inner marginal recess receiving a marginal portion of the bottom plate therein
   fasteners releasably securing said marginal portion of the bottom plate in said recess,
   a sealing gasket including a channel portion embracing a marginal portion of the top plate and having a depending flexible skirt in sealing engagement with a top face of the bottom plate retainer frame,
   tooling pins dependingly secured to the top plate inwardly of the bottom plate retainer frame, said bottom plate having a corresponding number of tooling pin guide bushings therein,
   column springs disposed between the bottom plate retainer frame and top plate and biasing the top plate to an upward position,
   a trim frame on the fixture having snap locking engagement with the bottom plate retainer frame and opposing upward movement of the top plate under the biasing force of said column springs, there being a vacuum chamber between the top and bottom plates having a margin defined by said flexible skirt of the sealing gasket, the bottom plate retainer frame having a vacuum port formed therethrough in communication with said vacuum chamber, and
   a vacuum adapter for applying a partial vacuum to the vacuum chamber coupled with the bottom plate retainer frame.

2. A vacuum test fixture for testing printed circuit boards as defined as in claim 1, further comprising a cushioning and locating pad for a printed circuit board under test on said top plate.

3. A vacuum test fixture for testing printed circuit boards as defined in claim 1, further comprising an extension flange carried by said top plate retainer frame and overlying said marginal portion of the top plate, and a sealing gasket interposed between said flange and top plate.

4. A vacuum test fixture for testing printed circuit boards as defined in claim 1, further comprising said tooling pins comprising a pair of such pins near diagonally opposite corners of the top and bottom plates.

5. A vacuum test fixture for testing printed circuit boards as defined in claim 1, further comprising said fasteners comprising a series of thumb screws threadedly engaged in said bottom plate retainer frame and having heads beneath the bottom plate and retainer frame and overlapping said marginal portion of the bottom plate.

6. A vacuum test fixture for testing printed circuit boards as defined in claim 1, further comprising a base frame for the vacuum test fixture having a patch board therein including terminals and lead wires electrically connected with said array of test probes, the base frame being hingedly secured to the bottom plate retainer frame.

7. A vaccum test fixture for testing printed circuit boards as defined in claim 6, further comprising a gas-air cylinder connected between the base frame and said bottom plate retainer frame.

* * * * *